United States Patent [19]

Funaki

[11] Patent Number: 5,444,284
[45] Date of Patent: Aug. 22, 1995

[54] SEMICONDUCTOR DEVICE INCLUDING POLYSILICON SEMICONDUCTOR ELEMENT AND MOS-FET AS THE ELEMENT THEREOF

[75] Inventor: Masaki Funaki, Yokohama, Japan

[73] Assignee: Victor Company of Japan, Ltd., Yokohama, Japan

[21] Appl. No.: 247,279

[22] Filed: May 23, 1994

Related U.S. Application Data

[63] Continuation of Ser. No. 950,223, Sep. 24, 1992, Pat. No. 5,367,190.

[30] Foreign Application Priority Data

Sep. 24, 1991 [JP] Japan .................... 3-271983

[51] Int. Cl.⁶ ............... H01L 27/01; H01L 27/00; H01L 29/78
[52] U.S. Cl. .................... 257/364; 257/66; 257/412; 257/607; 257/655
[58] Field of Search ............ 257/66, 364, 412, 607, 257/655

[56] References Cited

U.S. PATENT DOCUMENTS 5,367,190 11/1994 Funaki .................. 257/607

FOREIGN PATENT DOCUMENTS 61-48977 3/1986 Japan .................... 257/66

OTHER PUBLICATIONS

S. T. Hsu, "The Limitation of Short Channel-Length N, -Polysilicon-Gate CMOS ICs", RCA Review, vol. 46, Jun. 1985, pp. 153-162.

Primary Examiner—V. Ngô Ngô
Attorney, Agent, or Firm—Jacobson, Price, Holman & Stern

[57] ABSTRACT

A semiconductor device has a semiconductor element comprising polycrystal silicon and into which high-concentration donors and high-concentration acceptors have been introduced in substantially the same amounts, and enables control of a work function of a semiconductor element by adjustment of the concentrations of the donor and acceptor. This semiconductor device is manufactured by the formation of a heat oxide film on a semiconductor substrate, the use of a low-pressure CVD method to form a polysilicon thin film to a required thickness, the implantation in the same high-concentrations of the donor and acceptor into the polysilicon thin film, and heat processing in a required atmosphere, for a required time and at a required temperature to diffuse and activate the injected donor and acceptor.

4 Claims, 11 Drawing Sheets

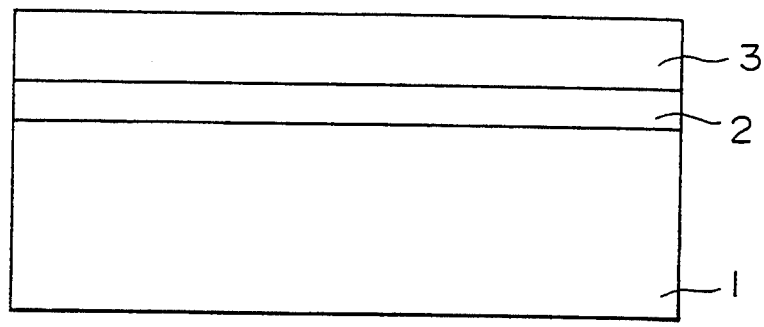
F I G. IA
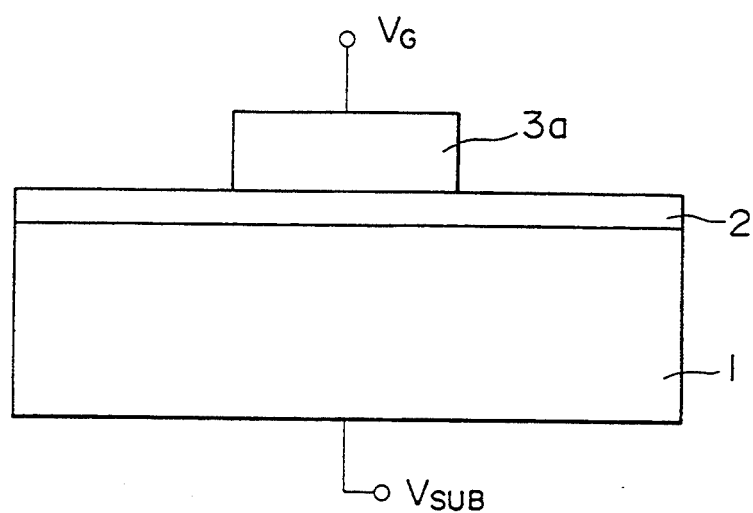
FIG.IB

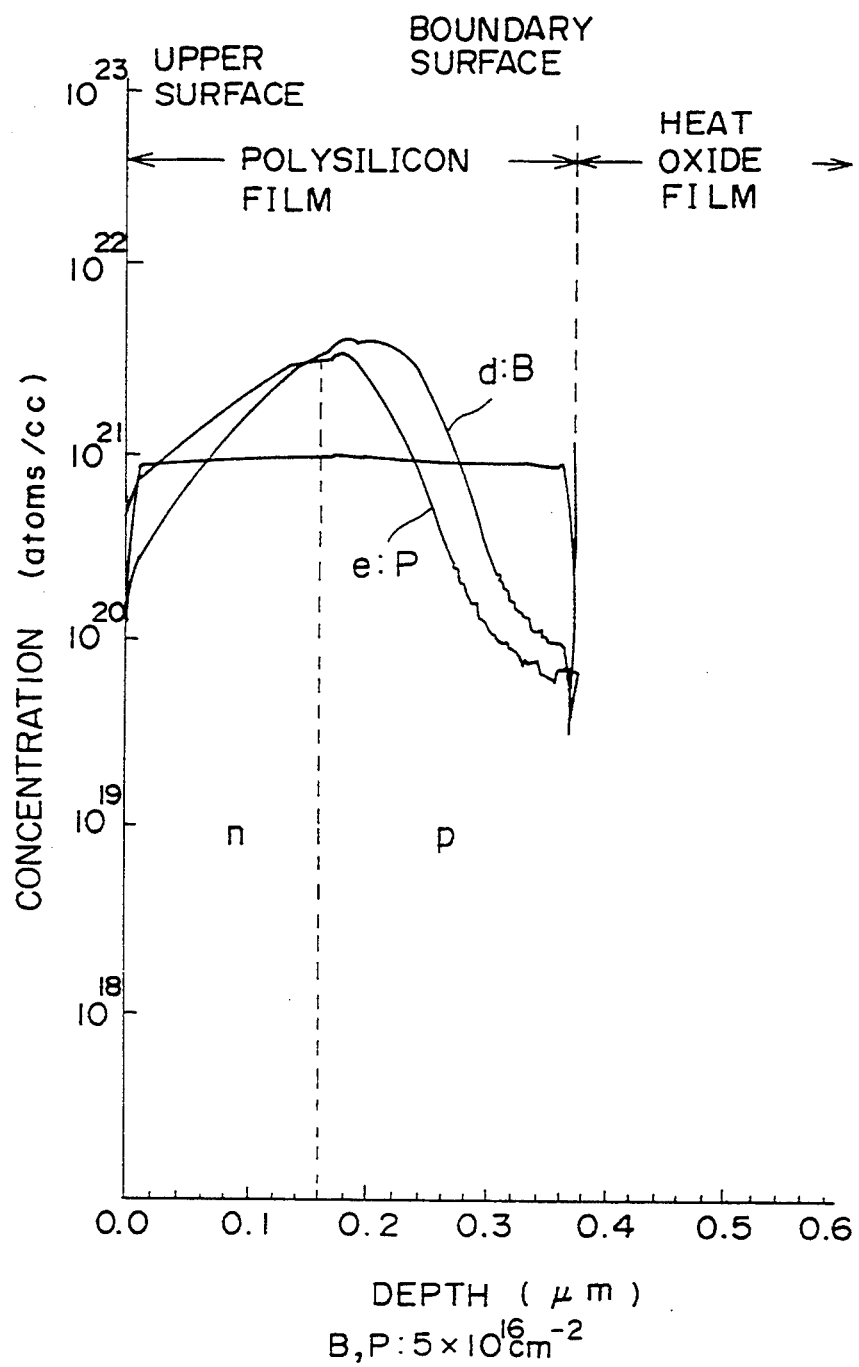
F I G. 4

SEMICONDUCTOR DEVICE INCLUDING POLYSILICON SEMICONDUCTOR ELEMENT AND MOS-FET AS THE ELEMENT THEREOF

This is a continuation of application Ser. No. 07/950,223, filed Sep. 24, 1992 now U.S. Pat. No. 5,367,190 issued on Nov. 22, 1994.

BACKGROUND OF THE INVENTION

The present invention relates to semiconductor devices which have semiconductor elements suitable for resistor elements, semiconductor wiring materials, connector elements, MOS (metal oxide semiconductor)-type FET (field effect transistor) gate electrodes and the like.

In the past, wiring materials and electrode materials for semiconductor devices have often used polysilicon. If this polysilicon is used as an intrinsic semiconductor, then it has a large resistance and so impurities are introduced into it so as to lower the value of the resistance. If the same amounts of donors and acceptors are introduced, they mutually cancel each other and the characteristics become the same as an intrinsic semiconductor, the value of the resistance becomes higher and hence only donors or acceptors are introduced in a high concentration and either an n+ type or a p+ type of semiconductor is used. The reason for the high concentration of either these donors or acceptors is to make the resistance as low as possible and to avoid the formation of a depletion layer.

In addition, conventionally, since there arises a rectifying action through the creation of a pn junction at a joint portion where a p-type polysilicon material and an n-type polysilicon material are directly joined, a metal such as aluminum or silicide (Si alloy) has been used as the material for the connection material of an ohmic connection between the p-type polysilicon material and the n-type polysilicon material but when a metal is used in the manufacture or a semiconductor, there arises contamination of the manufacturing apparatus due to the metal and a different manufacturing apparatus has to be used before and after the process using the metal. Because of this, a space for wiring has to be provided inside the semiconductor device during its manufacture and so there is a problem that the wiring process becomes complex.

Furthermore, when an n-type or a p-type polysilicon is used as a wiring material or a resistor element, the resistivity will be too high if the impurity concentration is low, and although there will be a low resistance if the concentration is above a certain level, the value of the resistance hardly changes for a high concentration and so the resistance value must be controlled by changing the sectional area of the wiring and the resistor.

There is a work function as one of the characteristic parameters of the semiconductor but when polysilicon is used, this work function is determined by the type (such as donor or acceptor) and the impurity concentration. However, as described above, only an n+ type or a p+ type is used and so it is only possible to have two types of work function, and the difference between these work functions is approximately 1.1 V which is the same as the band gap of silicon. Here, the work function has the meaning of the energy difference Φ [eV] between the Fermier level of a solid, and the energy (vacuum level) of free space outside a solid, and is the energy necessary to free electrons in an absolute zero state from the solid and into the space.

When polysilicon is used as a semiconductor device, it is only possible to use these two types of work functions and so it is not possible to have free control of the work function.

In addition, the threshold voltage $V_{TH}$ of a MOS-type FET is largely influenced by the impurity concentration of the channel region and by the work function of the gate electrode but when an n+ type or a p+ type polysilicon is used as the gate electrode of a MOS-type FET, that work function has a width of approximately 1.1 V and that value is an extremely large value with respect to the threshold voltage $V_{TH}$ which is normally 0.7 V and since it is not possible to change the work function, the value of the threshold voltage $V_{TH}$ is controlled by changing the impurity concentration of the channel region of the MOS-type FET.

However, when the impurity concentration of the channel region is made a higher concentration, the operating speed becomes slower and so the impurity concentration of the channel region can only be changed within a certain range in practice, and there is the problem that the range of control of the threshold voltage $V_{TH}$ is limited.

Not only this, when polysilicon is used as a wring material or a resistor element, changing that resistivity is extremely troublesome since the wiring width (sectional area) has to be changed in order to have control to a required value.

SUMMARY OF THE INVENTION

In order to solve these problems, the present invention has as an object the provision of a semiconductor element using polysilicon and which can have the resistivity and the work function controlled to required values.

The means for attaining this object is to provide a semiconductor device characterized in having a semiconductor element comprising polysilicon into which both donors and a substantially the same amount of acceptors have been introduced in such a high concentration that each of the concentrations of the donors and the acceptors exceeds that of silicon in at least a portion of the polysilicon.

Conventionally, when the same amounts of donors and acceptors have been introduced into a semiconductor of polysilicon, it was thought that there would be the same characteristics as the intrinsic semiconductor. However, it has been determined that the characteristics change when both donors and acceptors are introduced to high concentrations, and that the amounts of introduction can control the work function of the polysilicon. In particular, when used as a gate electrode for a MOS-type FET, changing the amounts of introduction to change the work function enables control of the threshold voltage.

The semiconductor device of the present invention has a semiconductor element comprising polysilicon to which both donors and acceptors have been introduced in substantially the same amounts, and so changing the impurity density which is included in the polysilicon of the semiconductor element enables the work function to be controlled.

Then, the MOS-type FET of the present invention can have the threshold voltage $V_{TH}$ controlled by changing the impurity concentration which is included in the polysilicon of the gate electrode and so there is the effect of enabling the control of the threshold voltage $V_{TH}$ without having to change the operating speed of the FET.

In addition, a wiring material and a resistor element in the semiconductor device of the present invention has the impurity implantation amount of one portion changed after wiring and so it is possible to use that portion as a resistor element and to obtain the necessary resistivity, and therefore easily control the resistivity without having to change the wiring width.

Furthermore, the connector element is the semiconductor device of the present invention can have an ohmic connection with the n+ type polysilicon and the p+ type polysilicon and so it is possible to have connection for polysilicon electrodes of different conductive types. In addition, unlike the conventional case, metal need not be used and so there is the effect of having no contamination of the manufacturing apparatus due to metal, and of the processes of manufacture being simplified.

BRIEF DESCRIPTION OF THE DRAWINGS

In the appended figures:

FIGS. 1A and 1B are configuration views showing a semiconductor device according to a first embodiment of the present invention;

FIG. 4 is a graph showing the impurity profile of the present invention;

DETAILED DESCRIPTION OF THE PREFERRED EMBODIMENTS

The following is a description of a MOS-type FET and a semiconductor device according to the present invention, with reference to the appended drawings.

First, a heat oxide film 2 having a thickness of 1500 Å is formed on an n− substrate 1 and the low pressure CVD (chemical vapor deposition) method is used to form a polysilicon thin film 3 having a thickness 3800 Å on top of this. Furthermore, substantially equal atom numbers of boron (B) and phosphorous (P) are implanted as acceptors at 50 KeV and 100 KeV respectively into this polysilicon thin film 3. Then, after implantation, heat treatment is performed at 850° C. for 60 minutes in an atmosphere of $N_2$ and the implanted concentrations are diffused and activated to manufacture the semiconductor device shown in FIG. 1A.

Figure 2:
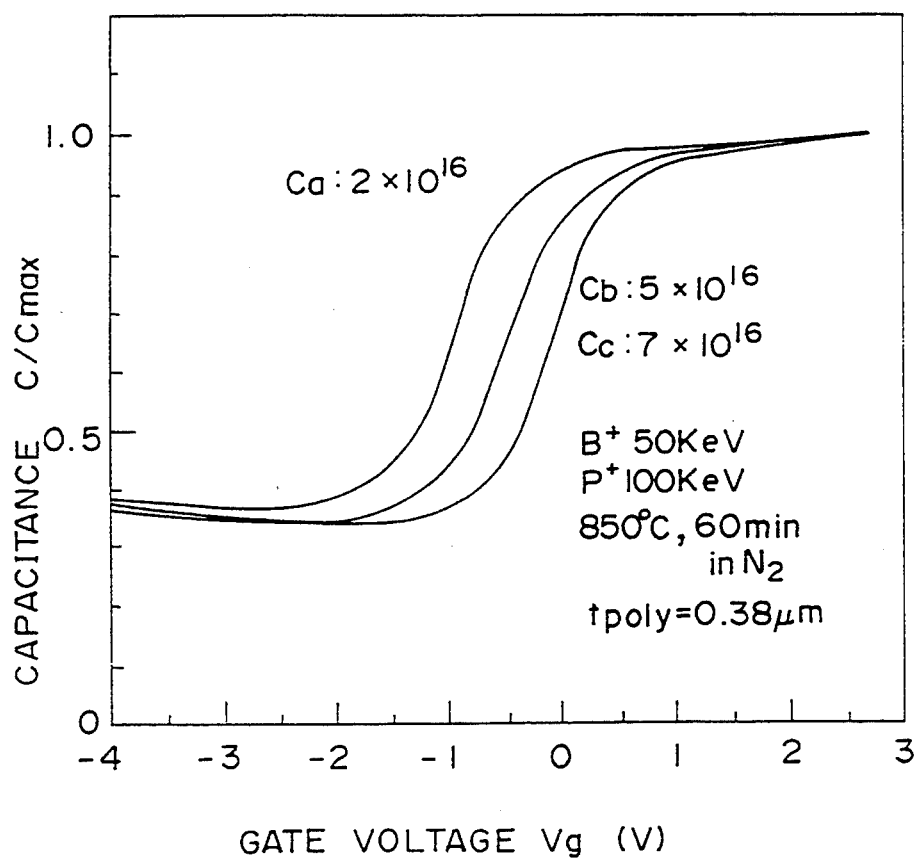
FIG. 2 is a graph showing the capacitance-voltage characteristic of the present invention.

Then, as shown in FIG. 1B, this polysilicon thin film 3 is etched and made the gate electrode 3a, and a voltage is impressed across this gate electrode 3a and the n− substrate 1 and the capacitance-voltage characteristic (C-V characteristic) measured when the amounts of implantation of P and B are changed. FIG. 2 is a graph showing the results having the voltage on the horizontal axis and the capacitance C on the vertical axis in comparison with the capacitance $C_{max}$ of the case having only the heat oxide film 2 (without the polysilicon thin film) in which the capacitance is maximum. The curves $C_a$, $C_b$ and $C_c$ show when both P and B are injected at $2 \times 10^{16}$ cm$^{-2}$, $5 \times 10^{16}$ cm$^{-2}$ and $7 \times 10^{16}$ cm$^{-2}$, respectively. Moreover, curves of cases where both P and B were implanted in amounts between $2 \times 10^{16}$–$4.5 \times 10^{16}$ cm$^{-2}$ are shown substantially the same as the curve $C_a$, and between $4.5 \times 10^{16}$ to $6 \times 10^{16}$ cm$^{-2}$, curves are shifted from the curve $C_a$ to the curve $C_c$ according as the implantation amounts were increased, and above $6 \times 10^{16}$ cm$^{-2}$ curves are shown substantially the same as the curve $C_c$. When the amounts of implantation of P and B are small for the curve $C_a$ at this time, the characteristics of the polysilicon display the n+ type for the same as when only P has been implanted, and with the curve $C_b$, the gate voltage when there is the same capacitance as the curve $C_a$ rises approximately 0.5 V and displays the same characteristics as an intrinsic semiconductor, and for curve $C_c$ for which there are the largest amounts of injection of P and B, the gate voltage rises a further 0.5 V and characteristic of the p+ type is displayed in the same manner as when only B is injected into the polysilicon. From this, it can be judged that polysilicon having a work function intermediate between the n+ type and the p+ type is obtained by changing the amounts of implantation of P and B.

Figure 3:
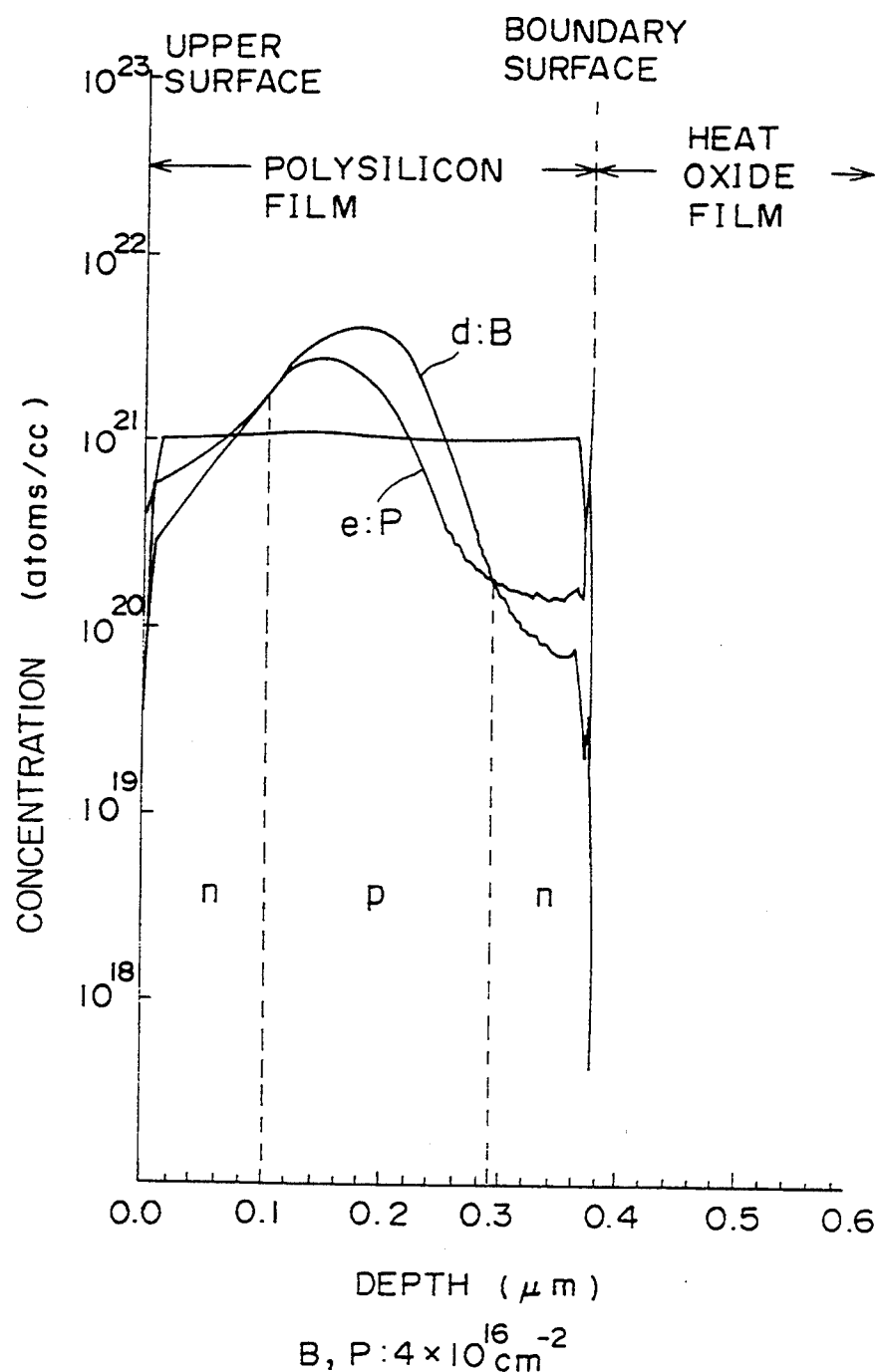
FIG. 3 is a graph showing the impurity profile of the present invention.
Figure 5:
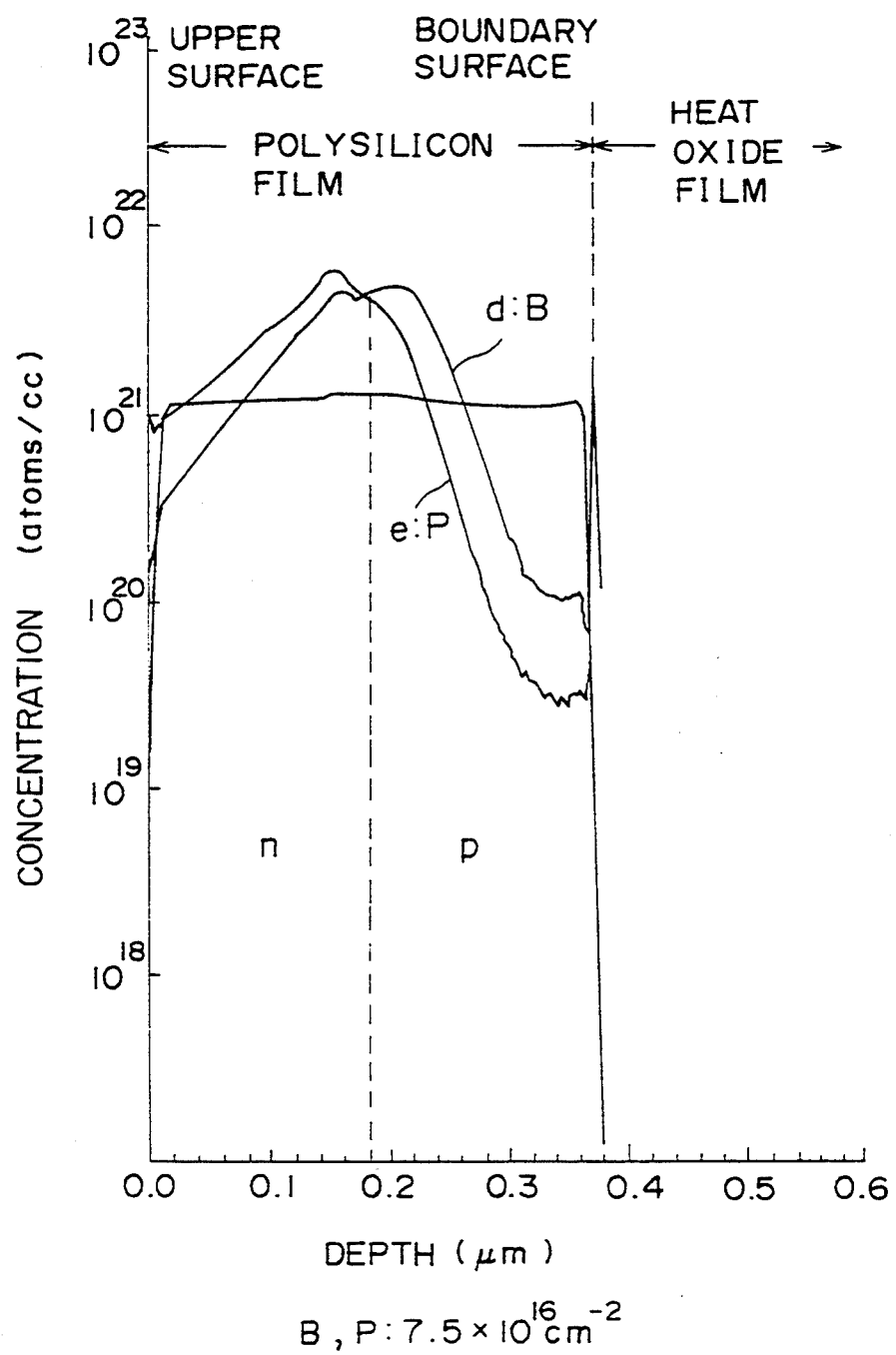
FIG. 5 is a graph showing the impurity profile of the present invention.

In addition, FIGS. 3–5 shows the results of using SIMS (secondary ion mass spectrograph) to investigate the impurity profile in the polysilicon when P and B were injected to $4 \times 10^{16}$ cm$^{-2}$, $5 \times 10^{16}$ cm$^{-2}$ and $7.5 \times 10^{16}$ cm$^{-2}$. In each of the figures, the horizontal axis shows the depth from the surface of the polysilicon thin film 3 in FIG. 1A, while the vertical axis is the concentration of P and B. In each of the figures, the curve that is substantially flat over the polysilicon film section shows the concentration of silicon. In each of the figures, when the concentrations of P and B in the vicinity of the depth of 0.38 μm which is the vicinity of the boundary surface between the polysilicon thin film 3 and the heat oxide film 2 are observed, it can be seen that in FIG. 3 when the implantation amount is small at $4 \times 10^{16}$ cm$^{-2}$, the concentration of P is higher as shown by the curve $C_e$ than that of the B as shown by the curve $C_d$, and so there is the n-type characteristic, and that as shown in FIG. 4 when the implantation amount is $5 \times 10^{16}$ cm$^{-2}$, the concentrations of P and B are substantially the same in the vicinity of the boundary surface, and that as shown in FIG. 5, when the implantation amounts are large at $7.5 \times 10^{16}$ cm$^{-2}$, the concentration of B is higher than that of P in the vicinity of the boundary surface and so there is the p-type characteristic. More specifically, when the amounts of implantation of impurities to the polysilicon thin film 3 are changed, there is a change in the results for the diffusion of the impurities and there is a change in the characteristics of the polysilicon thin film 3 in the vicinity of the boundary surface of the polysilicon thin film 3 and the heat oxide film 2, and which corresponds to the amount of implantation and so it is possible to control the work function.

Figure 6:
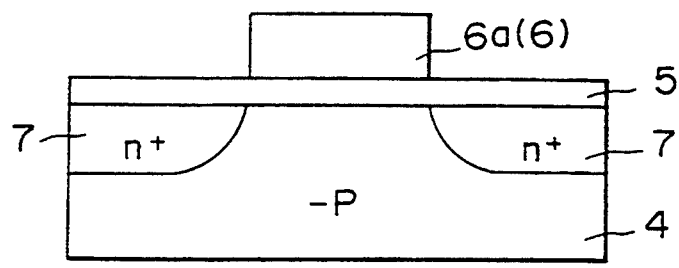
FIG. 6 is configuration view showing a MOS-type FET according to a second embodiment of the present invention.
Figure 7:
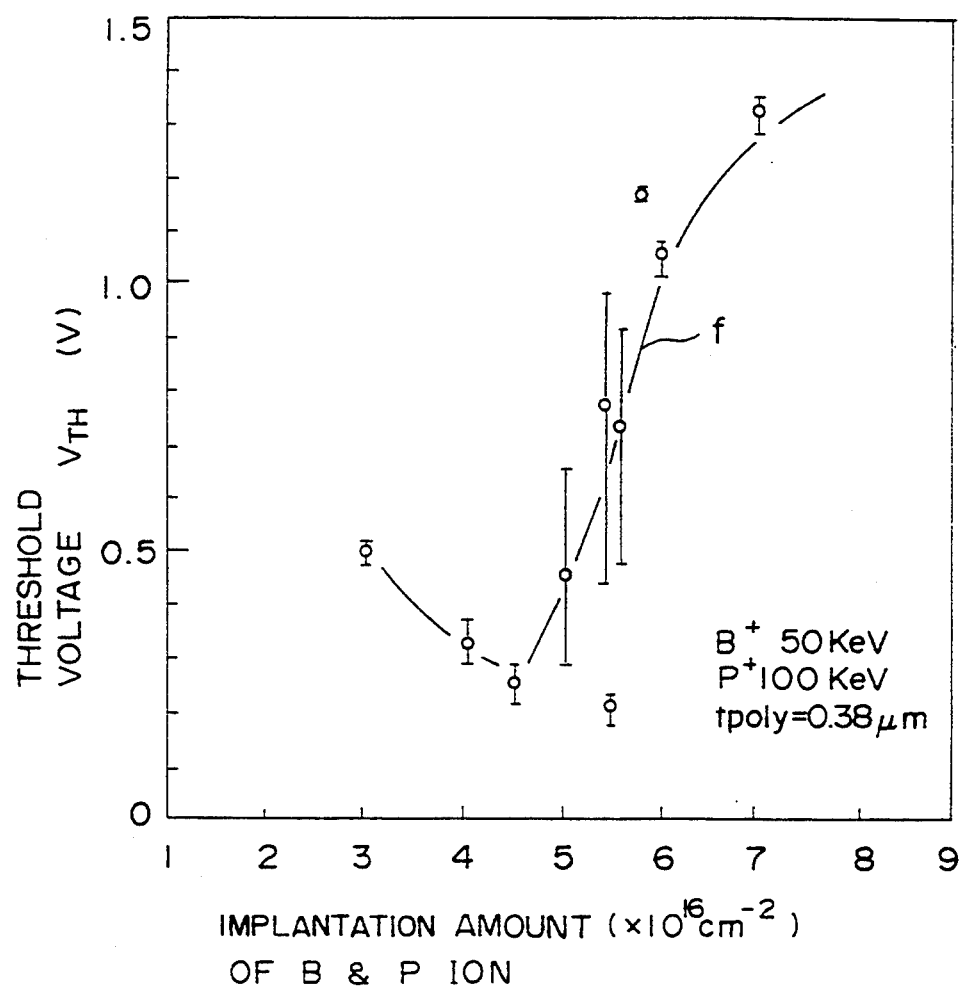
FIG. 7 is a graph showing the threshold voltage characteristics of a MOS-type FET according to a second embodiment of the present invention.

The following is a description of a second embodiment of the polysilicon thin film in which the work function is controlled, used in a gate electrode of a MOS-type FET (field effect transistor), with reference to FIGS. 6 and 7.

FIG. 6 is a configuration view of a MOS-type FET of the second embodiment of the present invention. This MOS-type FET has a heat oxide film 5 having a thickness of 180 Å first formed on a p$^-$ type substrate 4 and then the low pressure CVD method is used to form a polysilicon thin film 6 on top of this and having a thickness of 3800 Å. Furthermore, boron (B) and phosphorous (P) are then implanted in equal amounts into this polysilicon thin film 6 as acceptors and donors respectively, and at 50 KeV and 100 KeV respectively. Then, heat treatment performed in an N$_2$ atmosphere for 55 minutes at a temperature of 850° C., and the implanted impurities are diffused and made active, and furthermore, the polysilicon thin film 6 is etched and made the gate electrode 6a, this gate electrode 6a is used as a mask and P implanted at 100 KeV to a concentration of $1 \times 10^{15}$ cm$^{-2}$ and an n+ type source region 7 and drain region 8 formed on the p$^-$ type substrate 4. Heat treatment is then performed for 5 minutes at 850° C. and the impurities of the source region 7 and the drain region 8 are then diffused and made active.

Then, in the MOS-type FET shown in FIG. 6, the gate electrode (polysilicon thin film) 6a for which the amounts of implantation of P and B have been variously changed is used and the respective threshold voltages V$_{TH}$ measured. FIG. 7 shows the results for these measurements.

As can be seen from the graph shown in FIG. 7, the threshold voltage V$_{TH}$ when the implantation amount was $4.5 \times 10^{16}$ cm$^{-2}$ was least at approximately 0.25 V, and after this, there was an increase in the threshold voltage V$_{TH}$ with an increase in the implantation amount, and a value of more than 1.35 V was obtained, enabling control of the threshold voltage within a range having a width of more than 1.1 V. This change in the threshold voltage V$_{TH}$ is due to the change in the work function described above. As a result of this, control of the threshold voltage V$_{TH}$ which was conventionally performed by changing the impurity concentration of the channel region beneath the gate oxide film can be performed with the present invention by changing the impurity concentration of the gate electrode, thereby enabling control of the threshold voltage V$_{TH}$ over a wide range and without changing the operating speed of the FET.

The following is a description of a third embodiment of the present invention and which uses a polysilicon thin film as a wiring material. In the impurity profiles for the polysilicon and which are shown in FIGS. 3–5, FIG. 3 shows that the concentration of B is smaller than that of P at a depth of 0.1 μm from the surface of the polysilicon thin film when both P and B are implanted to $4 \times 10^{16}$ cm$^{-2}$, and that there is the n-type at this portion. Then, in the portion with a depth of from approximately 0.1 μm to 0.3 μm, the concentration of P is larger than that of B and so there is the p-type in this portion, while at a depth of 0.3 μm from the 0.38 μm to the boundary surface with the heat oxide film, the concentration of P is greater than that of B and there is the n-type in this portion. This shows that there is not the same diffusion with the high concentrations of both P and B impurities, and so the concentration of P is greater in the vicinity of the boundary surface with the heat oxide film and in the vicinity of the surface to produce the n-type, and because the impurities are not diffused equally and so there is a lower value for the resistance (conductivity).

In the same manner, when there is the implantation of both P and B to $5 \times 10^{16}$ cm$^{-2}$ as shown in FIG. 4, there is a greater concentration of P than there is of B at a depth of approximately 0.16 μm from the surface of the polysilicon film and so there is the n-type in this portion, while at a depth of 0.38 μm from the depth of approximately 0.16 μm to the boundary surface with the heat oxide film, there is a higher concentration of B than there is of P and so there is the p-type in this portion. Then, when both P and B are injected to $7.5 \times 10^{16}$ cm$^{-2}$ as shown in FIG. 5, then as for the case shown in FIG. 4, the concentration of P is larger than that of B at the region of a depth of approximately 0.18 μm from the surface of the polysilicon film and there is the n-type at this portion, while the concentration of P is larger than that of B at a depth of from approximately 0.18 μm to the boundary surface with the heat oxide film and there is the p-type at this portion.

Figure 8:
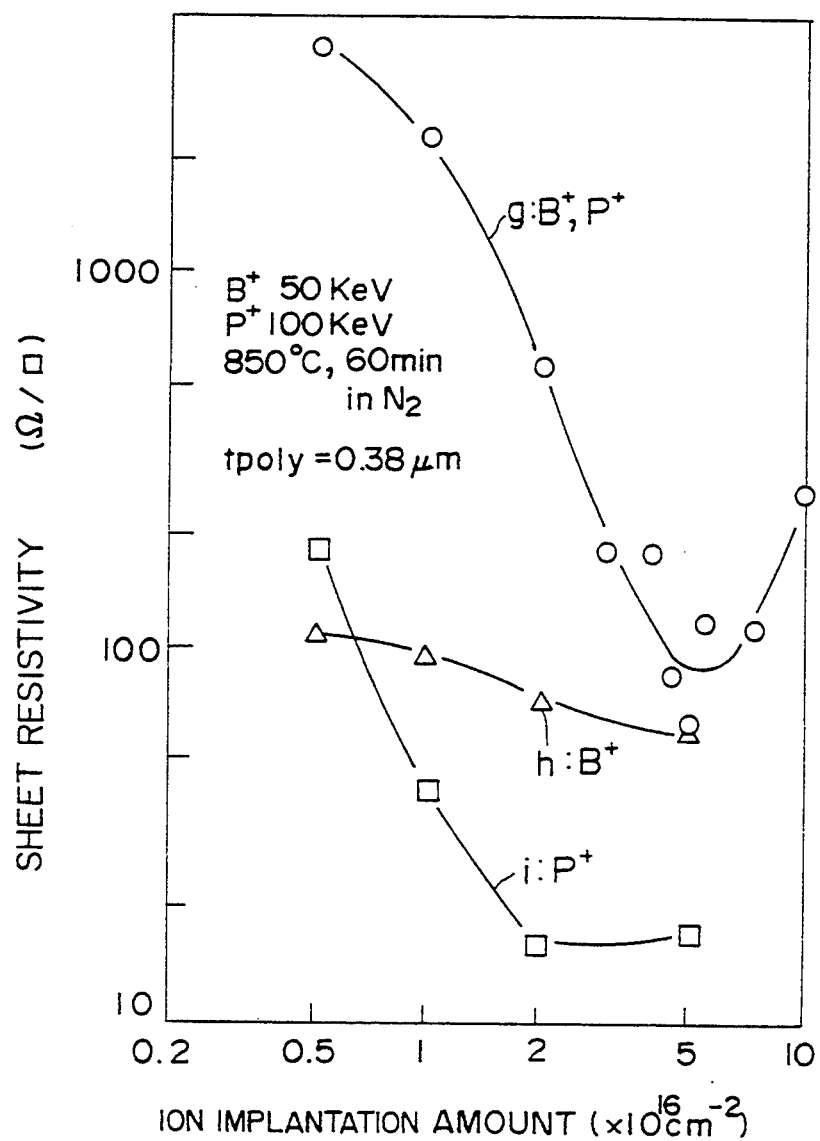
FIG. 8 is a graph showing the sheet resistivity of a polysilicon thin film when the impurity concentration is changed.

Then, the sheet resistance value of the polysilicon thin film 3 for the semiconductor device shown in FIG. 1A, was measured for when the amounts of implantation of B and P implanted in the same amounts to the polysilicon thin film 3 were changed, and these results are shown in FIG. 8 for the resistivities when there was implantation of B and P alone.

In FIG. 8, the B and P shown in the curve $C_g$ were implanted in the same amounts and the sheet resistivity of the polysilicon thin film 3 at this time was high when the amounts of implantation of B and P were small, but lowered with an increase in the implantation amounts, and was lowest when the amounts of implantation of B and P were both about $5 \times 10^{16}$ cm$^{-2}$, and became substantially the same resistivity when only B shown by curve $C_h$ was implanted. Accordingly, it is possible for a polysilicon thin film having both B and P implanted in the same amounts, to be used as a wiring material.

In addition, the resistivity at this time changes continuously in accordance with the amount of impurity implanted and so changing the amount of implantation of the impurities enables use as a resistor element which can obtain a required resistivity. Then, when there is practical use and B and P are both implanted in the same amounts, wiring by the polysilicon thin film and changing the amount of impurities implanted to that portion enables that portion to be used as a resistor element which can obtain the necessary resistivity. Furthermore, when a resistor element having a high resistivity is used, the implantation of only P or B at a low concentration causes depletion and prevents ohmic connection, but with the present invention, it is possible to have ohmic connection with a high resistivity.

Moreover, with the present invention, there is the same low resistivity as when only B is implanted and this is advantageous when there is used as a gate electrode of a MOS-type FET.

Figure 9:
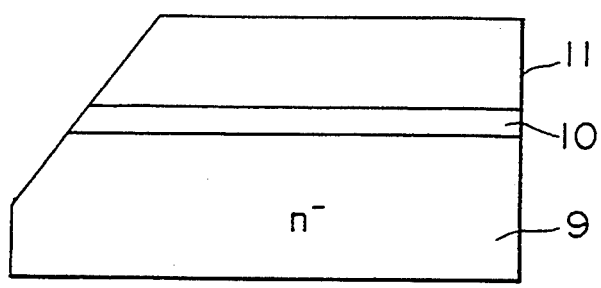
FIG. 9 is a configuration view showing a semiconductor device for which an increasing resistance was measured.
Figure 10:
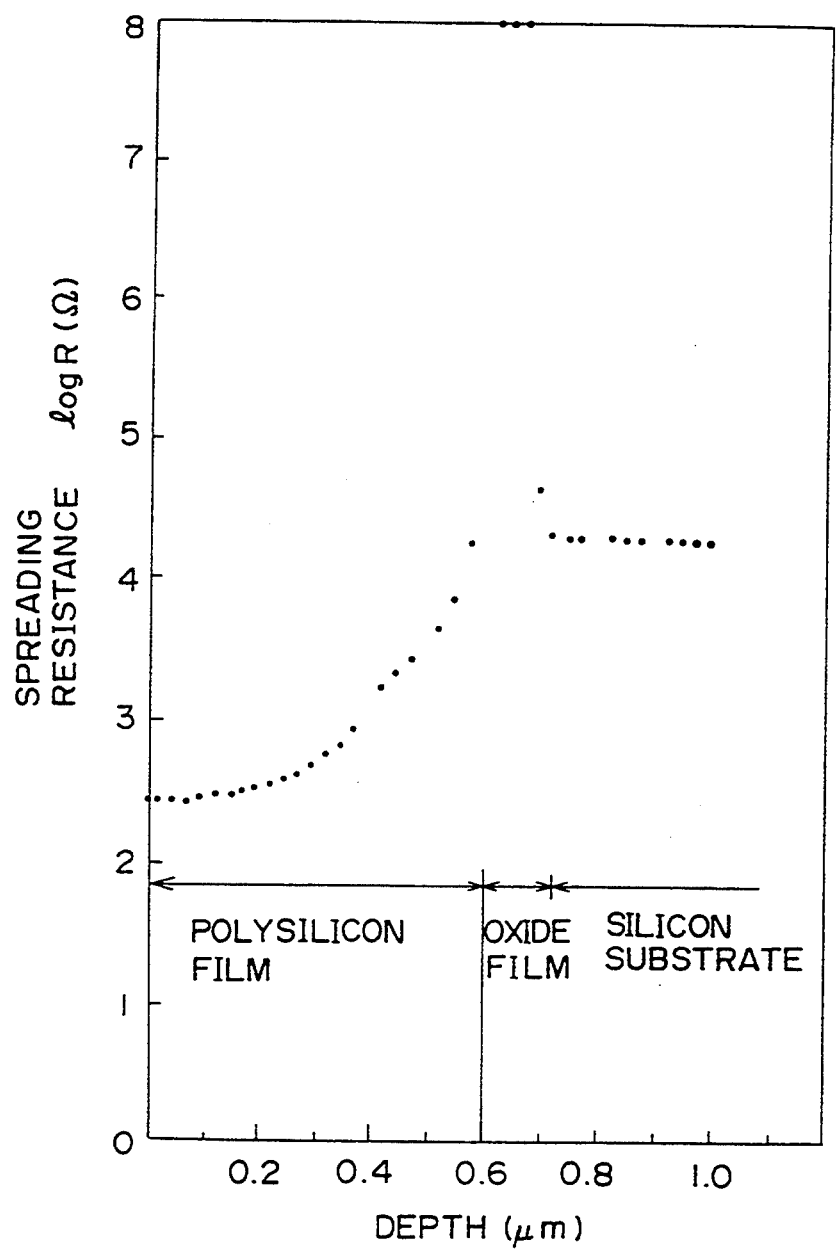
FIG. 10 is a graph showing the increasing resistance of a semiconductor device.

The following is a description of an embodiment used as a connector element of a polysilicon thin film. A pn junction occurs at the connector portion when there is direct connection between n+ type polysilicon and p+ type polysilicon and there is no ohmic connection. However, it both donors and acceptors are both implanted at high concentration into the polysilicon, then it is possible to have ohmic connection between the n+ type polysilicon and p+ type polysilicon. More specifically, when donors and acceptors are both implanted at high concentration into the polysilicon as described above for the wiring material and resistor element, there is a higher concentration of P in the vicinity of the surface, and there is an n-type portion, but there is a higher concentration of B internally and there is a p-type portion, and these portions have respectively different conductive natures. Because of this, there is no pn junction at the connection portion even if an n+ type and a p+ type are connected, and it is possible to have ohmic connection. In addition, if impurities are introduced at high concentration to a pn junction between an internal p-type portion and a surface n-type portion in the vicinity of the surface of the polysilicon into which both donors and acceptors have been implanted at high concentrations, then there will be an extremely small resist voltage and substantially ohmic connection, and it will be possible to have use as a conductor and a connector element. As shown in FIG. 9, an $SiO_2$ heat oxide film 10 having a thickness of 1.2 $\mu m$ is provided on a surface of an n- type substrate (Si substrate) 9 and a polysilicon thin film 11 having a thickness of 6 $\mu m$ is formed on top of this. FIG. 10 is a graph of the spreading resistance when the resistance has been measured for each of the points of a semiconductor device manufactured by the introduction of both P and B to densities of $7.5 \times 10^{16}$ cm$^{-2}$ to the polysilicon thin film 11 which has been cut diagonally. More specifically, the internal resistance from the top, from the polysilicon thin film 11 to a depth of 6 $\mu m$ of the boundary with the heat oxide film 10, gradually rises and there is no change in the resistivity due to internal depletion of the pn junction.

Figure 11:
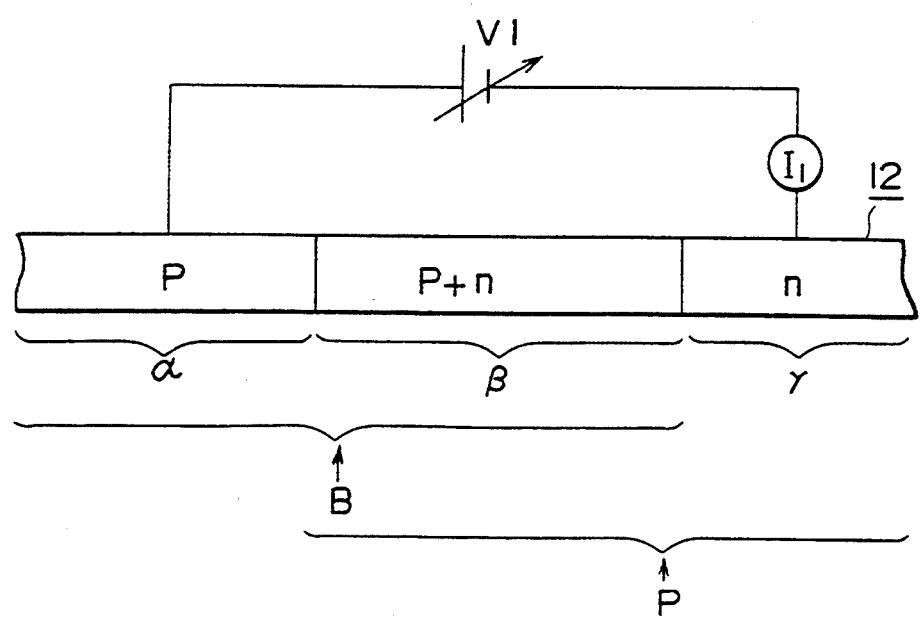
FIG. 11 is a configuration view showing a connector element of a semiconductor device according to a third embodiment of the present invention.

In addition, as shown in FIG. 11, when B is implanted into an a portion and a $\beta$ portion of polysilicon 12, and when P is implanted into the $\beta$ portion and a $\gamma$ portion and to the same amount as B, then the $\alpha$ portion will be p-type and the $\gamma$ portion will be n type and the $\beta$ portion will be a connector element into which both B and P have been implanted to the same amounts. Then, the implantation amounts where changed between $5 \times 10^{15}$ cm$^{-2}$, $1 \times 10^{16}$ cm$^{-2}$, $2 \times 10^{16}$ cm$^{-2}$, $5 \times 10^{16}$ cm$^{-2}$ and $7 \times 10^{16}$ cm$^{-2}$, a direct current voltage applied across the p-type $\alpha$ portion and the n-type $\gamma$ portion of the polysilicon 12, and the current measured when the voltage was changed. FIGS. 12-16 show the respective results.

Figure 12:
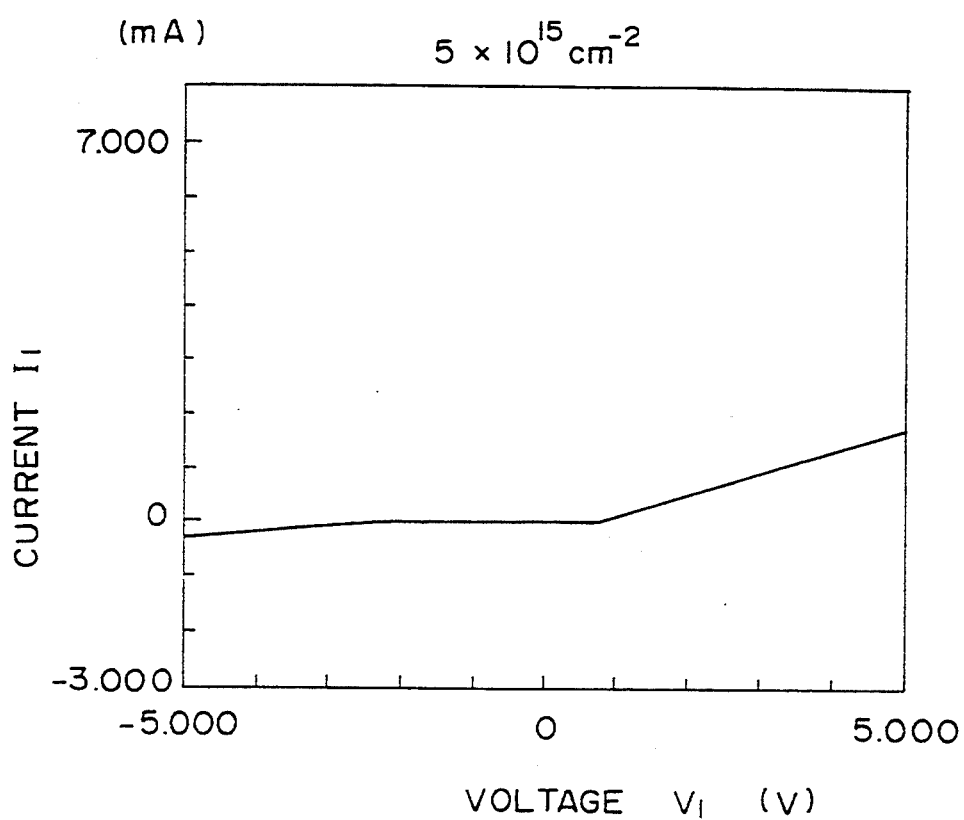
FIG. 12 is a graph showing the voltage-current characteristics of polysilicon into which P and B have been introduced to $5 \times 10^{15}$ cm$^{-2}$.
Figure 13:
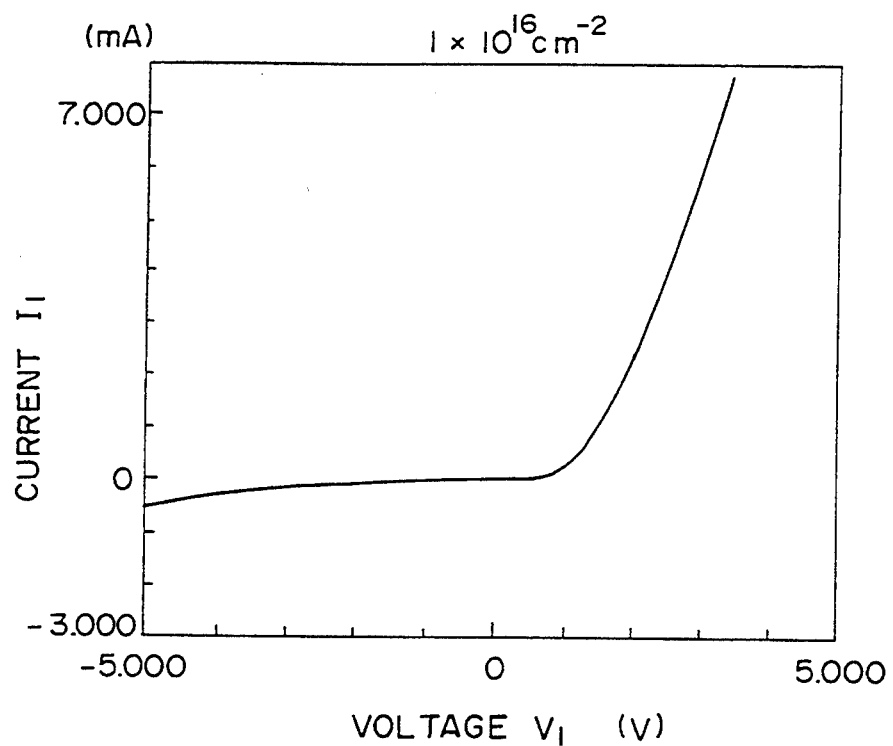
FIG. 13 is a graph showing the voltage-current characteristics of polysilicon into which P and B have been introduced to $1 \times 10^{16}$ cm$^{-2}$.
Figure 14:
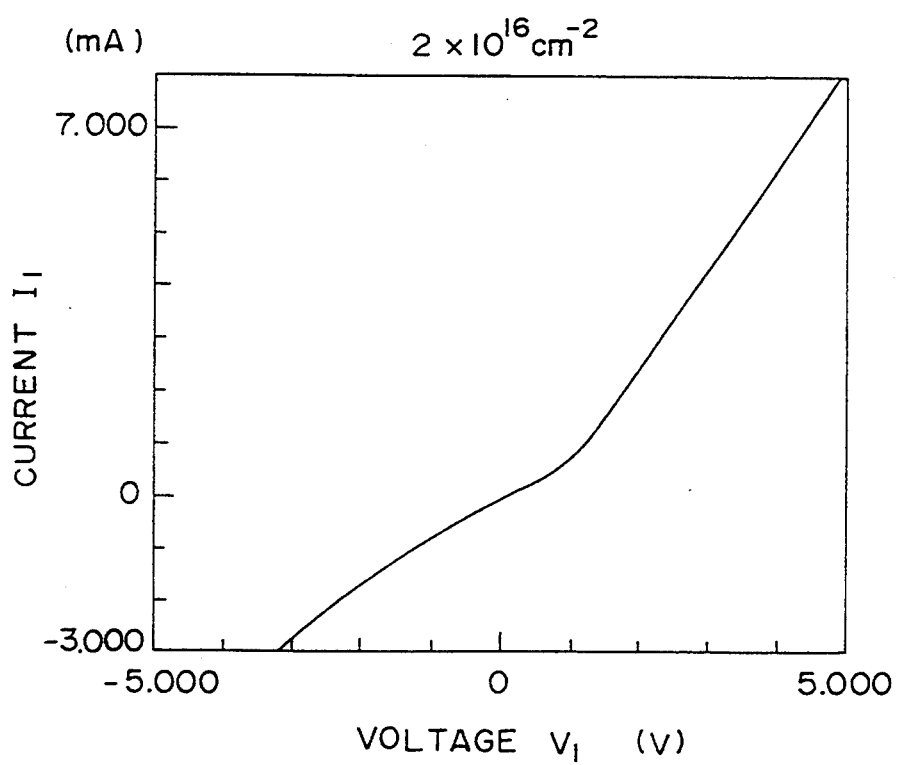
FIG. 14 is a graph showing the voltage-current characteristics of polysilicon into which P and B have been introduced to $2 \times 10^{16}$ cm$^{-2}$.
Figure 15:
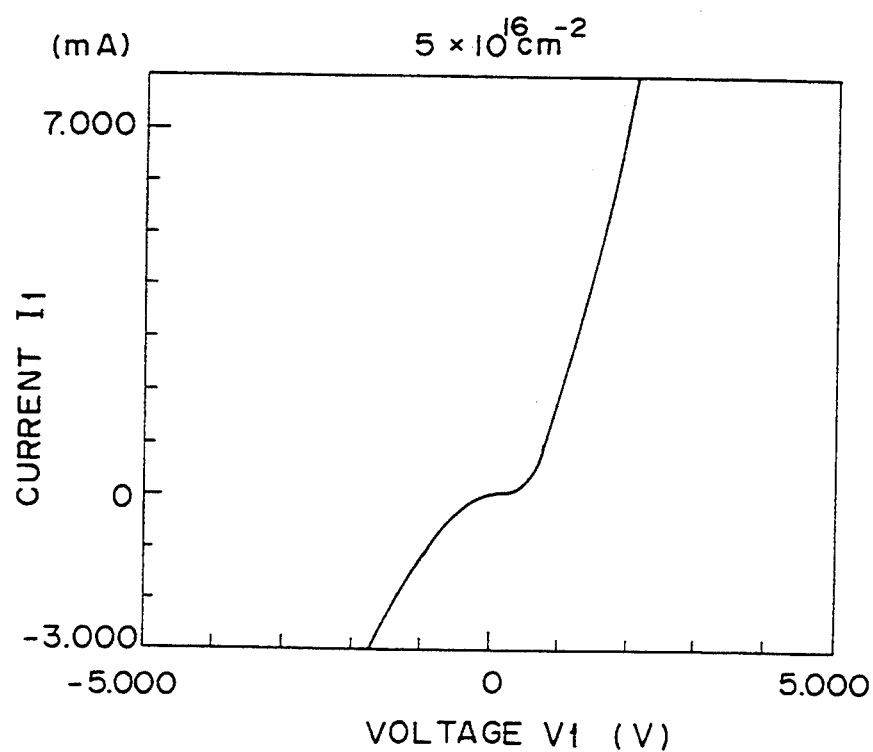
FIG. 15 is a graph showing the voltage-current characteristics of polysilicon into which P and B have been introduced to $5 \times 10^{16}$ cm$^{-2}$.
Figure 16:
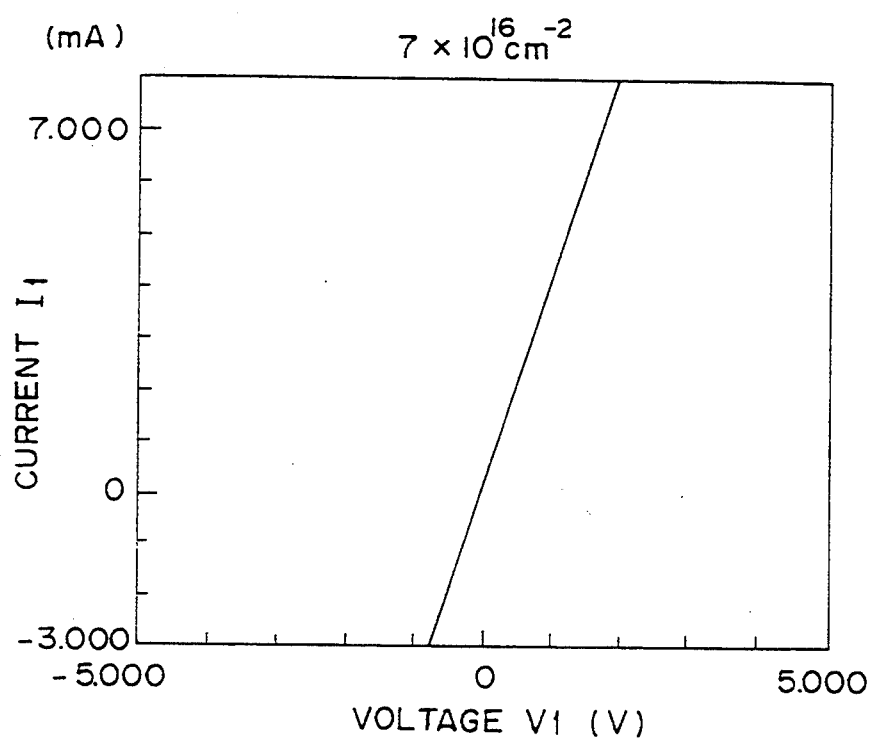
FIG. 16 is a graph showing the voltage-current characteristics of polysilicon into which P and B have been introduced to $7 \times 10^{16}$ cm$^{-2}$.

When there was introduction of $5 \times 10^{15}$ cm$^{-2}$ and $1 \times 10^{16}$ cm$^{-2}$ as shown in FIGS. 12 and 13, the amount of introduction is small, current flows in only one direction, and there is current rectifying action. However, when there was introduction of $2 \times 10^{16}$ cm$^{-2}$, $5 \times 10^{16}$ cm$^{-2}$ and $7 \times 10^{16}$ cm$^{-2}$ as shown in FIGS. 14-16, current flows in both directions, and it can be seen that there is an ohmic connection between the p-type $\alpha$ portion and the n-type $\gamma$ portion of the polysilicon 12.

In each of the first through third embodiments described above, boron (B) was used as the acceptor and phosphorous (P) was used as the donor but it is also possible to use $BF_2$ (boron fluoride) as the acceptor and phosphorous (P) as the donor, or $BF_2$ (boron fluoride), aluminum (Al), gallium (Ga), indium (In) as the acceptor and arsenic (As) or antimony (Sb) or the like as the donor.

What is claimed is:

1. A semiconductor device comprising a semiconductor element of polysilicon to which donors having high concentration and acceptors having high concentration have been both introduced in substantially the same amounts to such an extent that the concentrations of said donors and said acceptors exceeds a concentration of silicon in a portion of the polysilicon, wherein said semiconductor element comprises a connector element, and wherein said connector element has an ohmic connection between an element comprising a polysilicon of one conductive type and an element comprising a polysilicon of another conductive type.

2. A MOS-type FET comprising channel regions and a gate electrode including polysilicon, and the gate electrode being separated from the channel regions by insulating material, said gate electrode being doped with donors of high concentration and acceptors of high concentration in substantially the same amounts, and wherein a threshold value of the gate electrode is controlled by changing concentrations of said donors and acceptors into said gate electrode.

3. A MOS-type FET comprising channel regions and a gate electrode including polysilicon and, the gate electrode being separated from the channel regions by insulating material, said gate electrode to which donors and acceptors have been introduced in substantially the same amounts, and wherein a threshold value is controlled by changing concentrations of said donors and acceptors introduced into said gate electrode.

4. A MOS-type FET comprising channel regions and a gate electrode including polysilicon, and the gate electrode being separated from the channel regions by insulating material, said gate electrode being doped with donors at a concentration of more than $10^{21}$ Atoms/cm$^3$ and acceptors at a concentration of more than $10^{21}$ Atoms/cm$^3$ in substantially the same amounts, and wherein a threshold value is controlled by changing concentrations of said donors and acceptors introduced into said gate electrode.

* * * * *